United States Patent
Iliopoulos et al.

(10) Patent No.: US 10,309,013 B2
(45) Date of Patent: Jun. 4, 2019

(54) METHOD AND SYSTEM FOR IDENTIFYING A CLEAN ENDPOINT TIME FOR A CHAMBER

(71) Applicant: Applied Materials, Inc., Santa Clara, CA (US)

(72) Inventors: Ilias Iliopoulos, Foster City, CA (US); Shuo Na, Sunnyvale, CA (US); Jose Albor, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 683 days.

(21) Appl. No.: 14/208,688

(22) Filed: Mar. 13, 2014

(65) Prior Publication Data
US 2014/0279750 A1 Sep. 18, 2014

Related U.S. Application Data

(60) Provisional application No. 61/798,975, filed on Mar. 15, 2013.

(51) Int. Cl.
*G06F 15/18* (2006.01)
*C23C 16/44* (2006.01)
*B08B 13/00* (2006.01)

(52) U.S. Cl.
CPC .......... *C23C 16/4405* (2013.01); *B08B 13/00* (2013.01)

(58) Field of Classification Search
CPC .......................... B08B 13/00; C23C 16/4405
See application file for complete search history.

(56) References Cited

U.S. PATENT DOCUMENTS

| 4,496,425 | A  | * | 1/1985 | Kuyel | C23F 4/00 204/192.32 |
| 2003/0045100 | A1 | * | 3/2003 | Saka | B24B 37/013 438/689 |
| 2006/0255260 | A1 | * | 11/2006 | Ludviksson | C23C 14/54 250/288 |
| 2014/0107828 | A1 | * | 4/2014 | Zhu | G01R 31/2831 700/121 |

OTHER PUBLICATIONS

Eric Bluem, Jean-Philippe Vassilakis, Mickael Thiercelin, Michel Aube, Harald Birk, "EV-140 P, New Emission Spectrospopic Product for Semiconductor Endpoint, Cleaning and Plasma Chambers Control", Horiba Technical Reports, special english edition No. 39, Sep. 2012, pp. 130-135.*

David Fredlake and Mike Bonner, "Optimization of the Chamber Clean Cycle for PECVD Process Tools", Advanced Energy Industries, 2000, pp. 1-4.*

Staff, Process Sense Model 2076A, Infrared Chamber clean Endpoint Sensor, MKS Instruments, Inc., 2 Tech Drive, Suite 201, Andover, MA 01810 Note: page updated at www.mkinst.com website on Oct. 21, 2007.*

* cited by examiner

*Primary Examiner* — Luis A Sitiriche
(74) *Attorney, Agent, or Firm* — Lowenstein Sandler LLP

(57) ABSTRACT

Systems and methods are provided for determining a clean endpoint time for a current run of a chamber. The clean endpoint time for the current run may be determined by determining that a chamber parameter, such as a chamber pressure, has stabilized. Historical clean endpoint time data is updated by adding the clean endpoint time for the current run of the chamber. A recommended clean endpoint time is then determined for the chamber based on the updated historical clean endpoint time data.

14 Claims, 6 Drawing Sheets

METHOD AND SYSTEM FOR IDENTIFYING A CLEAN ENDPOINT TIME FOR A CHAMBER

CROSS REFERENCE TO RELATED APPLICATION

This application claims the benefit of priority of U.S. Provisional Patent Application No. 61/798,975, filed Mar. 15, 2013, which is hereby incorporated by reference herein in its entirety.

TECHNICAL FIELD

Implementations of the present disclosure relate to chamber cleaning, and more particularly, to identifying a clean endpoint time for a chamber.

BACKGROUND

Process chambers used for deposition in display and semiconductor industries are typically periodically cleaned, depending on the product, to remove contaminants and residue deposits from the walls and the gas distribution plate by dry cleaning using plasma enhanced etching. Some traditional solutions use a fixed clean endpoint time for the cleaning process. Fixed times may lead to under-etching and/or over-etching, which can cause damage to the chamber. Under-etching can create particle issues while over-etching can cause accelerated hardware wear by halogens and especially fluorine.

Generally, a chemical vapor deposition (CVD) chamber clean process is closely monitored for potential damage caused by underetch and overetch. However, continuous monitoring of the cleaning process run-after-run on multiple chambers can be costly. There have been numerous previous attempts that use optical emission or detection spectroscopy to estimate the clean endpoint time. Traditional solutions monitor the intensity of the reflection of a light beam or the variations of optical wavelengths emitted from the plasma as the plasma undergoes gas phase changes. The signal to noise ratio is not sufficiently high in many cases. Furthermore, the associated hardware to measure the amplitudes of such signals are expensive since the signal varies substantially from element to element.

Some traditional solutions attempt to estimate the clean endpoint time using pressure. A stabilized pressure may serve as an indicator that the cleaning process can be ended. However, conventional pressure based solutions usually result in endpoints that are noisy and exhibit large time fluctuations due to the nature of the pressure measurements. Traditional solutions generally use a small data set to determine when pressure stabilizes as an indicator that a clean endpoint time has been reached. For example, some conventional solutions may use only a few seconds to determine if pressure has stabilized. Small windows of time may include noise which typically leads to inaccurate clean endpoint time calculations, and may thus be generally unreliable.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" implementation in this disclosure are not necessarily to the same implementation, and such references mean at least one.

DETAILED DESCRIPTION

Implementations of the disclosure are directed to a method and system for identifying a clean endpoint time for a chamber. A server computer system determines a clean endpoint time for a current run of a chamber and adds the clean endpoint time for the current run of the chamber to historical clean endpoint time data for the chamber to update the historical data. The server computer system determines a recommended clean endpoint time for the chamber based on the updated historical data and provides the recommended clean endpoint time to a system and/or user (e.g., process engineer, system engineer, industrial engineer, system administrator, etc.). Unlike conventional solutions, implementations minimize the run-to-run fluctuations of the clean endpoint time of a chamber by performing statistical analysis using the recent history of the chamber. Unlike traditional solutions that implement a fixed clean endpoint time for all chambers, implementations determine a recommended clean endpoint time for a particular chamber and/or particular recipe and/or particular process that is running on the chamber. Implementations provide a more accurate estimate of the time that may be used for the chamber to be cleaned and take into account the condition of the chamber. Implementations use a larger window time than traditional solutions to minimize the effect of pressure drift and pressure fluctuations in the calculations of clean endpoint time.

Figure 1:
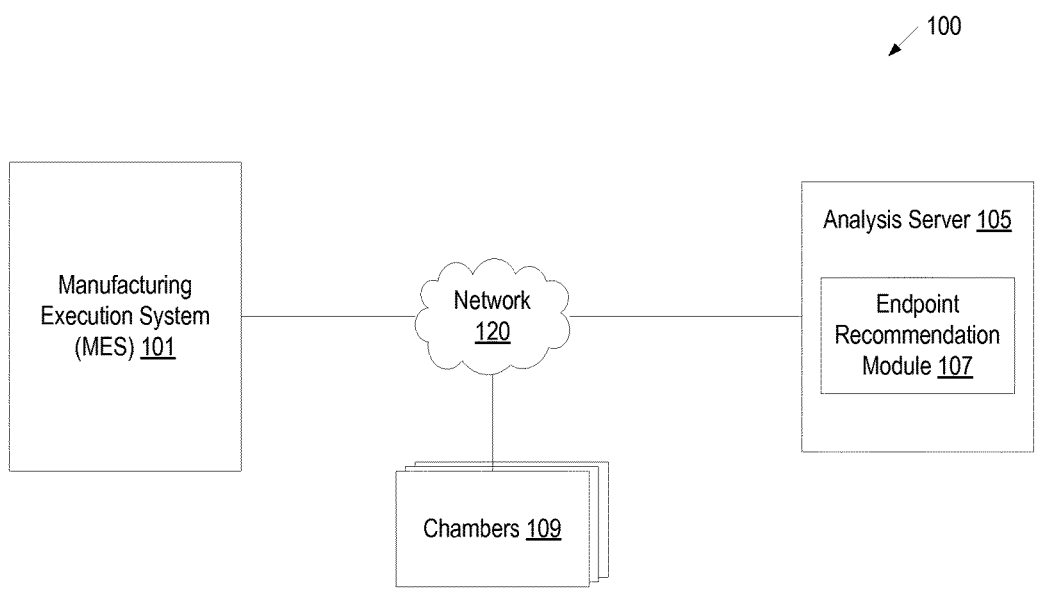
FIG. 1 is a block diagram illustrating a scheduling system utilizing an endpoint recommendation module.

FIG. 1 is a block diagram illustrating a manufacturing system 100 including a fabrication system data source (e.g., manufacturing execution system (MES) 101), one or more chambers 109, and an analysis server 105 communicating, for example, via a network 120. The network 120 can be a local area network (LAN), a wireless network, a mobile communications network, a wide area network (WAN), such as the Internet, or similar communication system.

The MES 101, analysis server 105, and endpoint recommendation module 107 can be individually hosted by any type of computing device including server computers, gateway computers, desktop computers, laptop computers, tablet computers, notebook computers, personal digital assistants (PDAs), mobile communications devices, cell phones, smart phones, hand-held computers, or similar computing devices. Alternatively, any combination of MES 101, analysis server 105, and endpoint recommendation module 107 can be hosted on a single computing device including server computers, gateway computers, desktop computers, laptop computers, mobile communications devices, cell phones, smart phones, hand-held computers, or similar computing devices.

The analysis server 105 can collect and analyze data relating to cleaning chambers 109. In one implementation, the analysis server 105 is coupled to a factory system data source (e.g., MES 101, ERP) to receive lot data and equipment (e.g., chamber) data, etc. In one implementation, the analysis server 105 can receive data directly from a chamber 109. The analysis server 105 can include an endpoint recommendation module 107 to use real-time data and historical data relating to cleaning chambers 109 to recommend a clean endpoint time for the individual chambers 109. The endpoint recommendation module 107 can provide the recommended clean endpoint time to a user (e.g., process engineer, system engineer, industrial engineer, system administrator, etc.) and/or system (e.g., scheduler, chamber 109, etc.).

Figure 2:
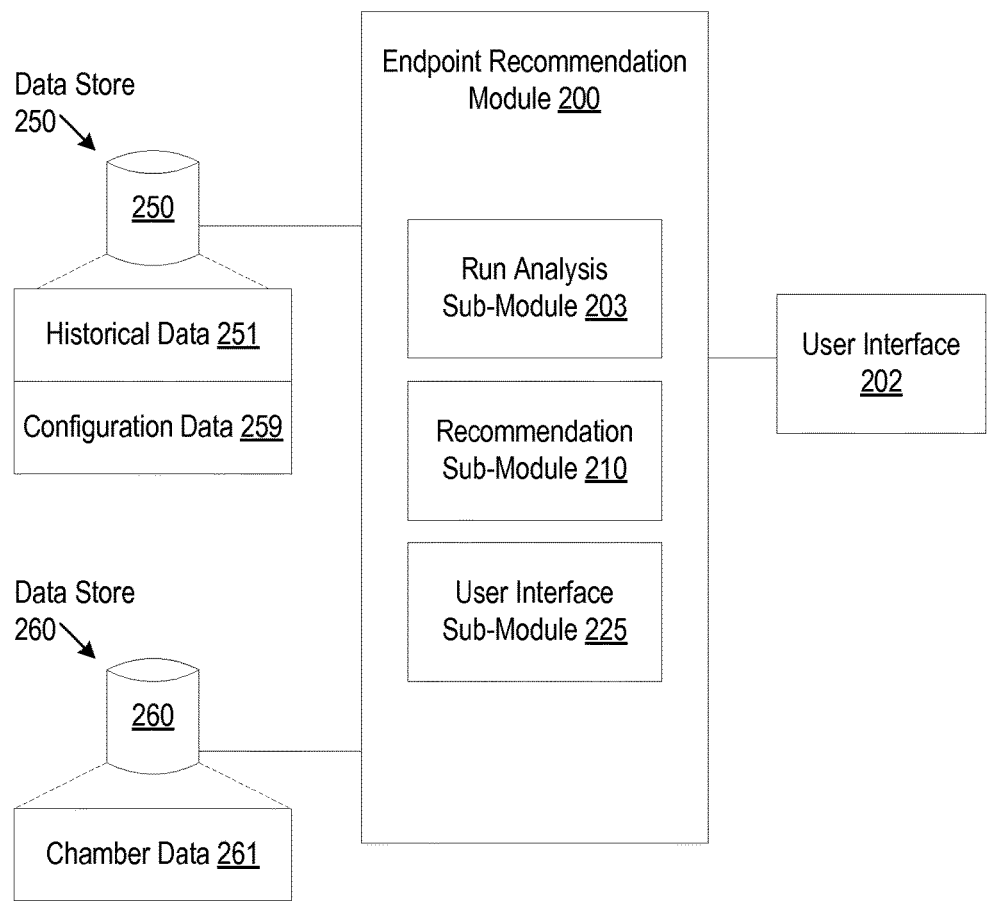
FIG. 2 a block diagram of one implementation of an endpoint recommendation module.

FIG. 2 is a block diagram of one implementation of an endpoint recommendation module 200. In one implementation, the endpoint recommendation module 200 can be the same as the endpoint recommendation module 107 of FIG. 1. The endpoint recommendation module 200 can include a run analysis sub-module 203, a recommendation sub-module 210, and a user interface (UI) sub-module 225.

The endpoint recommendation module 200 can be coupled to one or more data stores 250,260. The data stores 250,260 can be a persistent storage unit. A persistent storage unit can be a local storage unit or a remote storage unit. Persistent storage units can be a magnetic storage unit, optical storage unit, solid state storage unit, electronic storage unit (main memory) or similar storage unit. Persistent storage units can be a monolithic device or a distributed set of devices. A 'set', as used herein, refers to any positive whole number of items. The data stores 250,260 may be maintained on any device available via the network 120. For example, data stores 250,260 may be maintained on a server computer, gateway computer, desktop computer, laptop computer, mobile communications device, cell phone, smart phone, hand-held computer, or similar computing device.

The data store 260 can store chamber data 261 for one or more chambers. The chamber data 261 can include data describing the time to run a cleaning process on the chamber and the corresponding pressure measurements for the various times. The chamber data 261 can be provided by the chambers and/or a system (e.g., MES) in the manufacturing site. The user interface (UI) sub-module 225 can present chamber data 261 for a particular chamber in a user interface 202. The user interface 202 can be a graphical user interface (GUI) implemented on any suitable device. For example, the GUI may be implemented on a different device than analysis server 105. The chamber data 261 in the GUI can describe the time to run a cleaning process on the chamber and the corresponding pressure measurements for the various times. The chamber data 261 can track the pressure evolution during the chamber cleaning process using a time window.

Figure 3:
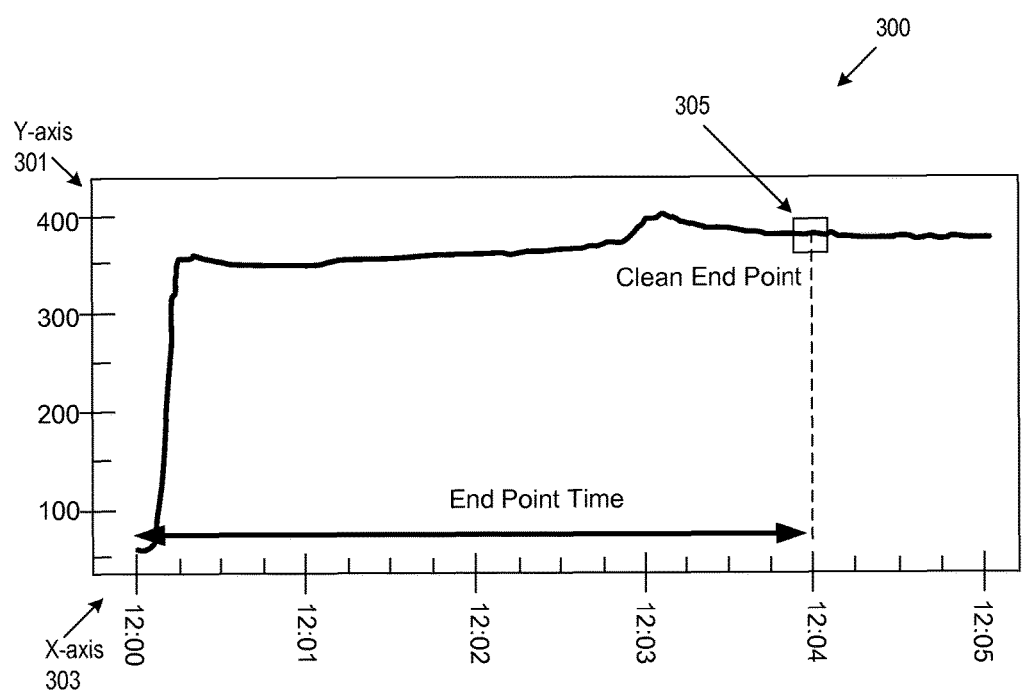
FIG. 3 illustrates an example graphical user interface including data for determining a clean endpoint time using an endpoint recommendation module, according to various implementations.

FIG. 3 is an example GUI 300 illustrating the time to run a cleaning process on a chamber and the corresponding pressure measurements for the various times, according to various implementations. For example, GUI 300 may represent chamber data for Run-6 on Chamber-A. The y-axis 301 can be pressure and the x-axis 303 can be time (e.g., minutes, seconds, etc.) for the run for the chamber. The endpoint recommendation module can use the chamber data in GUI 300 to determine the clean endpoint time for the particular run on the chamber. Once the pressure is stabilized, the endpoint time can be identified. For example, the endpoint recommendation module may determine that the clean endpoint time 305 for Run-6 on Chamber-A may be twelve minutes and four seconds. One implementation for determining the clean endpoint time for a run on a chamber is described in greater detail below in conjunction with FIG. 5.

Returning to FIG. 2, the run analysis sub-module 203 can use the chamber data 261 to identify the clean endpoint time for the run for the chamber. For example, the chamber itself may determine that the clean endpoint time for Run-1 was two hundred eighty seconds and may store the value of two hundred eighty seconds as the clean endpoint time for Run-1 as part of the chamber data 261 in the data store 260. The run analysis sub-module 203 may extract the clean endpoint time value for the particular run for the chamber from the chamber data 261.

In another implementation, the run analysis sub-module 203 uses the chamber data 261 for the run on the chamber, and configuration data 260 that is stored in the data store 250 to calculate the clean endpoint time for the run. The configuration data 260 can specify parameters that the run analysis sub-module 203 may use to calculate the clean endpoint time for the run on the chamber. One implementation of the run analysis sub-module calculating the clean endpoint time for a run on a chamber is described in greater detail below in conjunction with FIG. 5.

The run analysis sub-module 203 can add the clean endpoint time for the run to the historical data 251 for the chamber in the data store 250. The historical data 251 can include data for one or more chambers. The historical data 251 can include data for the last runs for a period of time for a corresponding chamber. The number of runs and the period of time can be defined in the configuration data 259. The configuration data 259 can be pre-defined and/or user-defined (e.g., by a system engineer, process engineer, industrial engineer, system administrator, etc.).

The historical data 251 can include the per run clean endpoint times for a chamber, for example, as determined by the run analysis sub-module 203 using the chamber data 261. In another implementation, the historical data 251 can include the per run clean endpoint times for a chamber as received from a chamber.

The recommendation sub-module 210 can use the historical data 251 to identify a recommended clean endpoint time for the chamber. The recommendation sub-module 210 can use a subset of the historical data 251. For example, the recommendation sub-module 210 may use historical data 251 from the last five days. The configuration data 259 can specify the subset of historical data 251 that may be used.

Figure 4:
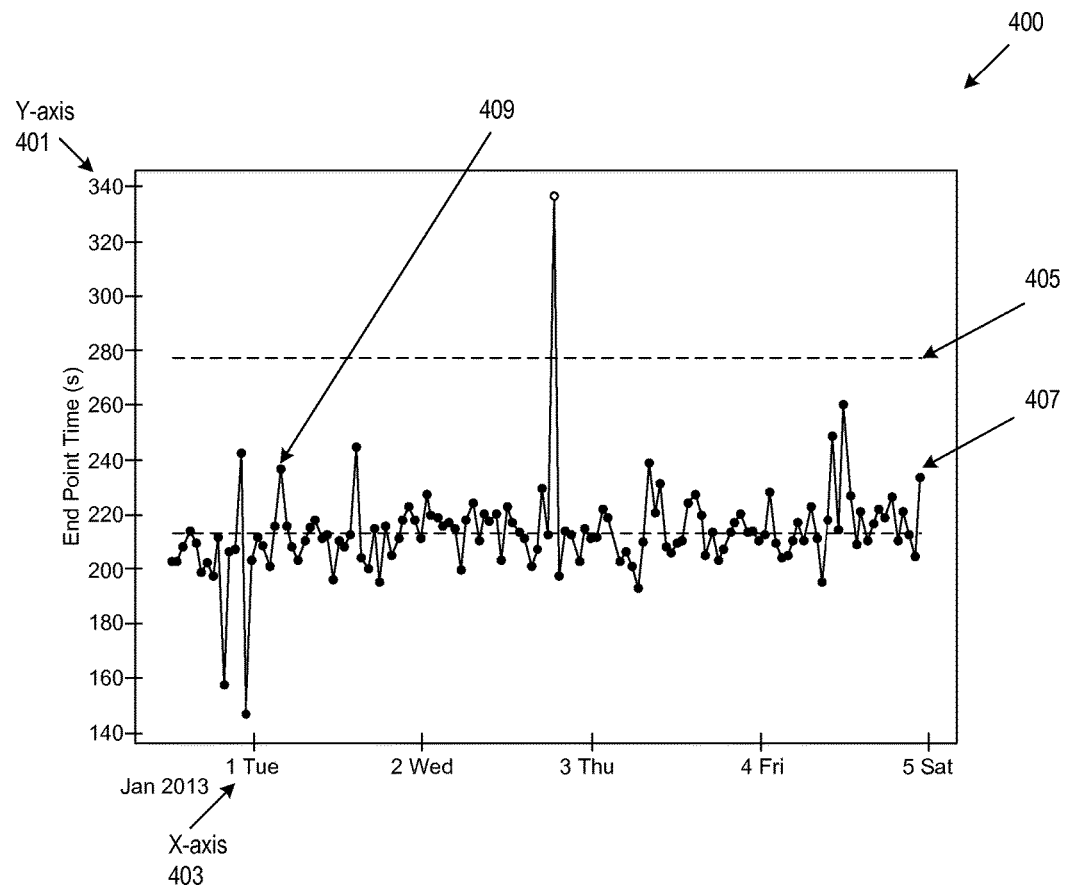
FIG. 4 illustrates an example graphical user interface including historical data for cleanings of a chamber for recommending a clean endpoint time, according to various implementations.

FIG. 4 illustrates an example graphical user interface 400 including historical data for various cleanings run on a particular chamber for recommending a clean endpoint time, according to various implementations. The y-axis 401 can be the per run clean end point time (e.g., minutes, seconds) for the chamber and the x-axis 403 can be time period (e.g., day, hour, etc.) for which the runs were executed on the chamber. For example, GUI 400 includes an x-axis 403 representing the runs for Chamber-A that have been executed in the last five days (e.g., Monday-Friday). Each data point 407 can represent the end point time for the corresponding run. For example, data point 409 may be the clean endpoint time of two hundred thirty-five seconds for Run-5 on Tuesday for Chamber-A. The endpoint recommendation module can analyze the historical data for the chamber to identify a recommended clean endpoint time. One implementation for determining a recommended clean endpoint time for a chamber using historical data for the chamber is described in greater detail below in conjunction with FIG. 5. For example, the endpoint recommendation module may determine from the data in GUI 400 that the recommended clean endpoint time 405 for Chamber-A is two hundred seventy-eight seconds.

Figure 5:
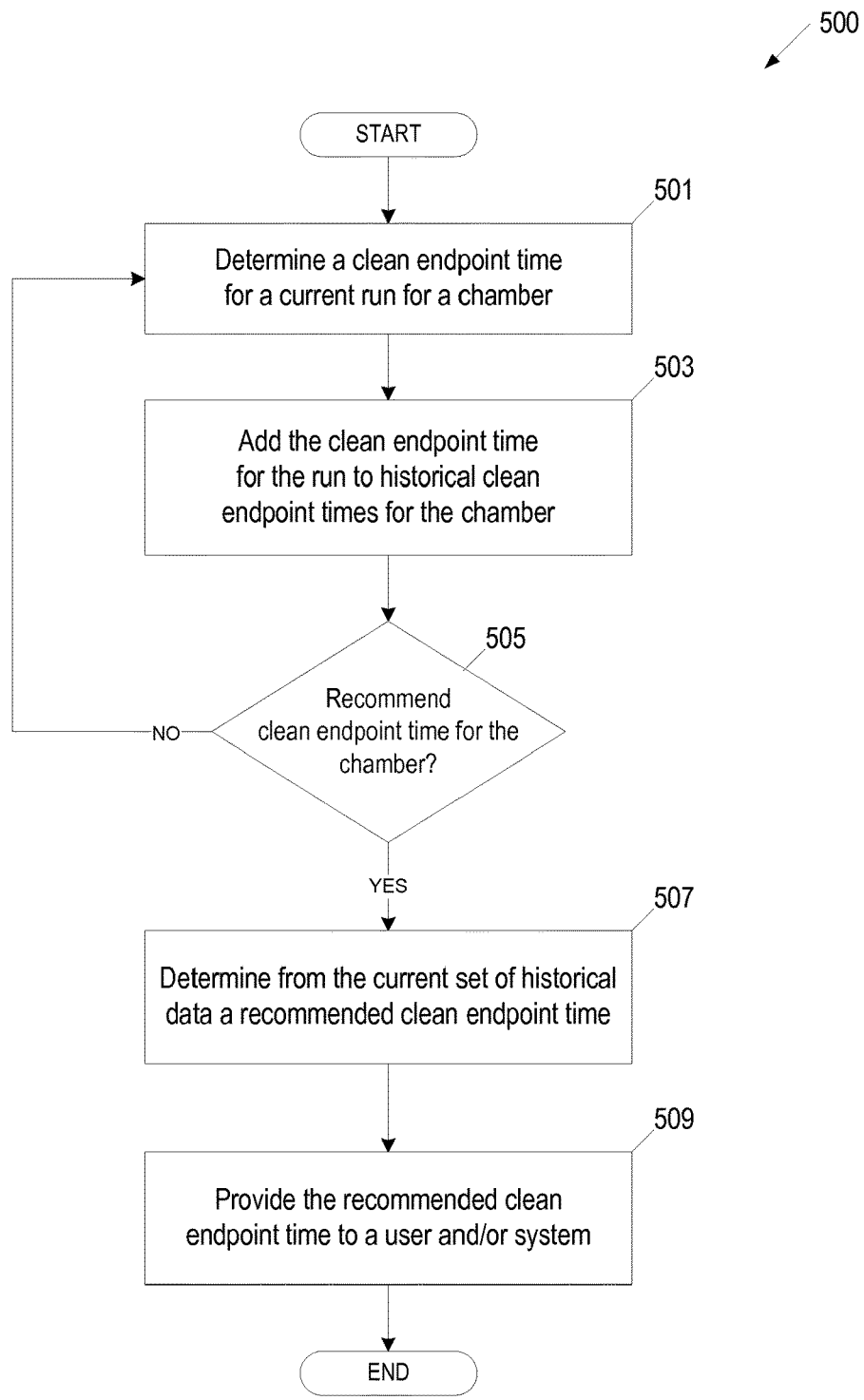
FIG. 5 illustrates one implementation of a method for identifying a clean endpoint time for a chamber using historical data for the chamber.

FIG. 5 is a flow diagram of an implementation of a method 500 for identifying a clean endpoint time for a chamber using historical data for the chamber. Method 500 can be performed by processing logic that can comprise hardware (e.g., circuitry, dedicated logic, programmable logic, microcode, etc.), software (e.g., instructions run on a processing device), or a combination thereof. In one implementation, method 500 is performed by the endpoint recommendation module 107 in server 105 of FIG. 1.

At block 501, the server determines a clean endpoint time for a current cleaning run for a chamber. In one implementation, the server identifies the clean endpoint time for the run in chamber data (e.g., chamber data 261) that is stored in a data store (e.g., data store 260) that is coupled to the server. For example, the chamber may determine the clean endpoint time for the run and may store the data in the data store. In another implementation, the server uses chamber data for the chamber that is stored in the data store and configuration data (e.g., configuration data 259) to calculate the clean endpoint time for the run on the chamber. The configuration data can specify parameters that the server may use to calculate the clean endpoint time for the run. The configuration data can be stored in a data store (e.g., data store 250) that is coupled to the server.

The configuration data can include a size of a window of time which the server can use for determining the clean endpoint time for the run. For example, the window may be x seconds. Unlike traditional solutions, the server can use a much larger window of time to determine when pressure is stable as an indicator that a clean endpoint time has been reached. The advantage in using a larger window in time is that the server can account for noise (e.g., fluctuations) in the pressure by minimizing the noise when calculating the clean endpoint time for the run. In one implementation, the server uses the window to determine an average pressure over a period of time. An example of a window can include, and is not limited to twenty-five seconds. A window can include multiple smaller windows. For example, the configuration data may specify that a smaller window is y seconds. In one implementation, the server can determine an average pressure for more than one window (e.g., smaller window) and can compare the pressure averages to each other to calculate a delta, and can compare the delta to a delta threshold. The configuration data can include an adjustable delta threshold. The delta threshold can define the scope of a differential between multiple data points (e.g., pressure measurements). For example, the server can compare the delta threshold against the delta between the averages between the multiple windows. The configuration data can be different for different recipes and/or processes that are run on the chamber. The server can use data from windows that satisfy the delta threshold to calculate the clean endpoint time for the run. The server can perform statistical analysis and/or various mathematical functions to calculate the clean endpoint time for the run using data from windows that satisfy the delta threshold. The configuration data is configurable and can be user-defined, allowing for the configuration of each of the aforementioned parameters.

At block 503, the server adds the clean endpoint time for the run to the historical clean endpoint time data for the chamber. At block 505, the server determines whether to recommend a clean endpoint time for the chamber. The server may receive a request to determine the recommended clean endpoint time for the chamber. For example, the request may be input from a system, a user (e.g., process engineer, industrial engineer, system engineer, system administrator) request received from user input via a GUI, etc. The server may determine a recommended clean endpoint time periodically. The period can be based on configuration data. For example, the configuration data may specify that a new recommended clean endpoint time is determined once a week, once a month, once a quarter, etc.

If the server does not recommend a clean endpoint time (block 505), the server can return to block 501 to determine the clean endpoint time for a current run for the chamber. If the server does recommend a clean endpoint time (block 505), the server uses the current set of historical clean endpoint time data for the chamber to determine the recommended clean endpoint time at block 507. The server can examine a subset of historical data based on the configuration data. For example, the server may use the data for the most recent runs on the chamber for the last five days. The server can examine the historical data for the chamber and calculate a time weighted average, which can filter fluctuations that arise from the pressure measurements or sensor drift.

The server can use the historical data to determine, for example and not limited to, an average, a minimum from the average, a maximum from the average, etc. The server can use the historical data to determine a noise distribution and can use the noise distribution to filter out the noise to determine a recommended clean endpoint time for the chamber. The recommended endpoint can be based on the average, minimum, and maximum values, and can be a value that may cover different factors that may affect that chamber. The server can identify a recommended endpoint that can accommodate one or more various fluctuations in the historical data. In one implementation, the server identifies outliers in the historical data and accounts for the outliers. For example, the server may determine that the recommended clean end point time of two hundred and seventy-eight seconds (e.g., reference 405 in FIG. 4), which can accommodate the one or more fluctuations in the historical data for the chamber. The configuration data can include one or more rules that the server can use to select the recommended clean end point time based on the average, minimum, maximum, etc. values.

At block 509, the server can provide the recommended clean endpoint time to a user (e.g., process engineer, industrial engineer, system engineer, system administrator) and/or system (e.g., chamber, scheduler, etc.). The server can provide the recommended clean endpoint time via a GUI, via a message over the network, etc. For example, the recommended clean endpoint time can be used for CVD tools.

Figure 6:
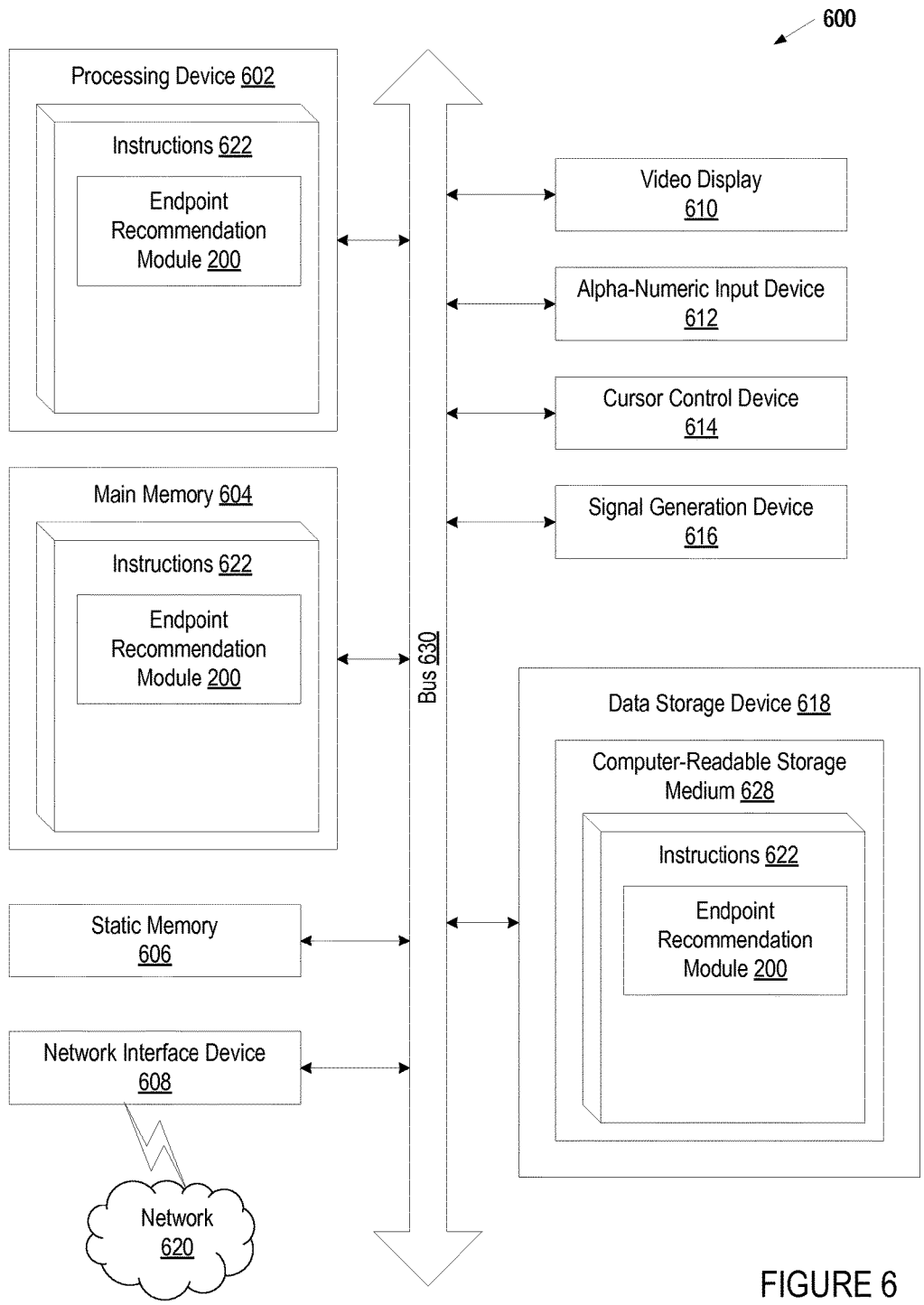
FIG. 6 illustrates an example computer system.

FIG. 6 is a block diagram illustrating an example computing device 600. In one implementation, the computing device corresponds to a computing device hosting an endpoint recommendation module 107 of FIG. 1. The computing device 600 includes a set of instructions for causing the machine to perform any one or more of the methodologies discussed herein. In alternative implementations, the machine may be connected (e.g., networked) to other machines in a LAN, an intranet, an extranet, or the Internet. The machine may operate in the capacity of a server machine in a client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer device 600 includes a processing system (processing device) 602, a main memory 604 (e.g., read-only memory (ROM), flash memory, dynamic random access memory (DRAM) such as synchronous DRAM (SDRAM), etc.), a static memory 606 (e.g., flash memory, static random access memory (SRAM), etc.), and a data storage device 618, which all communicate with each other via a bus 630. Each of the processing device 602, the main memory 604, and the data storage device 618 are capable of storing instructions 622 related to the endpoint recommendation module 200.

Processing device 602 represents one or more general-purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application specific integrated circuit (ASIC), a field programmable gate array (FPGA), a digital signal processor (DSP), network processor, or the like. The processing device 602 is configured to execute the endpoint recommendation module 200 for performing the operations and steps discussed herein.

The computing device 600 may further include a network interface device 608. The computing device 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The data storage device 618 may include a computer-readable storage medium 628 on which is stored one or more sets of instructions (e.g., instructions 622 for endpoint recommendation module 200) embodying any one or more of the methodologies or functions described herein. The endpoint recommendation module 200 may also reside, completely or at least partially, within the main memory 604 and/or within the processing device 602 during execution thereof by the computing device 600, the main memory 604 and the processing device 602 also constituting computer-readable media. The endpoint recommendation module 200 may further be transmitted or received over a network 620, such as network 120, via the network interface device 608.

While the computer-readable storage medium 628 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, transitory computer-readable storage media, including, but not limited to, propagating electrical or electromagnetic signals, or may be non-transitory computer-readable storage media including, but not limited to, volatile and non-volatile computer memory or storage devices such as a hard disk, solid-state memory, optical media, magnetic media, floppy disk, USB drive, DVD, CD, media cards, register memory, processor caches, random access memory (RAM), etc.

In the above description, numerous details are set forth. It will be apparent, however, to one of ordinary skill in the art having the benefit of this disclosure, that implementations of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "adding," "providing," or the like, refer to the actions and processes of a computing device, or similar electronic computing device, that manipulates and transforms data represented as physical (e.g., electronic) quantities within the computer system's registers and memories into other data similarly represented as physical quantities within the computer system memories or registers or other such information storage devices.

Implementations of the disclosure also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic or optical cards, or any type of media suitable for storing electronic instructions.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   determining, by a processing device, a clean endpoint time for a current run of a chamber by determining that a chamber pressure of the current run has stabilized;

retrieving, by the processing device, historical clean endpoint time data that is based on tracking of a time evolution profile of the chamber pressure during chamber cleaning over a historical period;
updating, by the processing device, the historical clean endpoint time data by adding the clean endpoint time for the current run of the chamber to the historical clean endpoint time data;
computing, by the processing device, a recommended clean endpoint time for the chamber to minimize an effect of run-to-run fluctuation of the chamber pressure over the historical period, wherein the recommended clean endpoint time for the chamber is computed based on the updated historical clean endpoint time data using a subset of the updated historical clean endpoint time data, the subset corresponding to a time window that comprises the clean endpoint time for the current run; and
causing the current run of the chamber to end at the recommended clean endpoint time for the chamber.

2. The method of claim 1, wherein determining that the chamber pressure of the current run of the chamber has stabilized comprises:
computing an average value of the chamber pressure for each of a plurality of time windows, wherein each of the plurality of time windows corresponds to a time period during the current run; and
computing a plurality of delta values, wherein each delta value corresponds to two windows of the plurality of windows that are adjacent to each other in time.

3. The method of claim 2, wherein determining that the chamber pressure of the current run of the chamber has stabilized further comprises:
comparing each of the plurality of delta values to a threshold delta value to identify a time window indicative of a stabilized chamber pressure, wherein the identified time window corresponds to the recommended clean endpoint time.

4. The method of claim 1, wherein determining the recommended clean endpoint time for the chamber based on the updated historical clean endpoint time data comprises:
determining a noise distribution in the updated historical clean endpoint time data;
and filtering out the noise in the updated historical clean endpoint time data based on the identified noise distribution.

5. The method of claim 1, further comprising:
transmitting the recommended clean endpoint time to a device of a network.

6. A system comprising:
a memory to store historical clean endpoint time data that is based on tracking a time evolution profile of the chamber pressure during chamber cleaning over a historical period; and a processing device, coupled to the memory, to:
determine a clean endpoint time for a current run of a chamber by determining that a chamber pressure of the current run has stabilized;
retrieve the stored historical clean endpoint time data;
update the historical clean endpoint time data by adding the clean endpoint time for the current run of the chamber to the historical clean endpoint time data;
compute a recommended clean endpoint time for the chamber to minimize an effect of run-to-run fluctuation of the chamber pressure over the historical period, wherein the recommended clean endpoint time for the chamber is computed based on the updated historical clean endpoint time data using a subset of the updated historical clean endpoint time data, the subset corresponding to a time window that comprises the clean endpoint time for the current run; and
cause the current run of the chamber to end at the recommended clean endpoint time for the chamber.

7. The system of claim 6, wherein determining that the chamber pressure of the current run of the chamber has stabilized comprises:
computing an average value of the chamber pressure for each of a plurality of time windows, wherein each of the plurality of time windows corresponds to a time period during the current run; and
computing a plurality of delta values, wherein each delta value corresponds to two windows of the plurality of windows that are adjacent to each other in time.

8. The system of claim 7, wherein determining that the chamber pressure of the current run of the chamber has stabilized further comprises:
comparing each of the plurality of delta values to a threshold delta value to identify a time window indicative of a stabilized chamber pressure, wherein the identified time window corresponds to the recommended clean endpoint time.

9. The system of claim 6, wherein determining the recommended clean endpoint time for the chamber based on the updated historical clean endpoint time data comprises:
determining a noise distribution in the updated historical clean endpoint time data; and filtering out the noise in the updated historical clean endpoint time data based on the identified noise distribution.

10. The system of claim 6, wherein the processing device is further to: transmit the recommended clean endpoint time to a device of a network.

11. A non-transitory computer-readable storage medium storing instructions which, when executed, cause a processing device to perform the operations of:
determining, by a processing device, a clean endpoint time for a current run of a chamber by determining that a chamber pressure of the current run has stabilized;
retrieving, by the processing device, historical clean endpoint time data that is based on tracking of a time evolution profile of the chamber pressure during chamber cleaning over a historical period;
updating, by the processing device, the historical clean endpoint time data by adding the clean endpoint time for the current run of the chamber to the historical clean endpoint time data;
computing, by the processing device, a recommended clean endpoint time for the chamber to minimize an effect of run-to-run fluctuation of the chamber pressure over the historical period, wherein the recommended clean endpoint time for the chamber is computed based on the updated historical clean endpoint time data using a subset of the updated historical clean endpoint time data, the subset corresponding to a time window that comprises the clean endpoint time for the current run; and
causing the current run of the chamber to end at the recommended clean endpoint time for the chamber.

12. The non-transitory computer-readable storage medium of claim 11, wherein determining that the chamber pressure of the current run of the chamber has stabilized comprises:
computing an average value of the chamber pressure for each of a plurality of time windows, wherein each of the plurality of time windows corresponds to a time period during the current run; and computing a plurality of delta values, wherein each delta value corresponds to two windows of the plurality of windows that are adjacent to each other in time.

13. The non-transitory computer-readable storage medium of claim 12, wherein determining that the chamber pressure of the current run of the chamber has stabilized further comprises:

comparing each of the plurality of delta values to a threshold delta value to identify a time window indicative of a stabilized chamber pressure, wherein the identified time window corresponds to the recommended clean endpoint time.

14. The non-transitory computer-readable storage medium of claim 11, wherein determining the recommended clean endpoint time for the chamber based on the updated historical clean endpoint time data comprises:

determining a noise distribution in the updated historical clean endpoint time data; and filtering out the noise in the updated historical clean endpoint time data based on the identified noise distribution.

\* \* \* \* \*